United States Patent
Yang et al.

(10) Patent No.: US 7,656,047 B2
(45) Date of Patent: Feb. 2, 2010

(54) SEMICONDUCTOR DEVICE PACKAGE AND MANUFACTURING METHOD

(75) Inventors: Jun Young Yang, Kaohsing (TW); You Ock Joo, Kaohsing (TW); You Pil Jung, Kaohsing (TW)

(73) Assignee: Advanced Semiconductor Engineering, Inc., Kaohsing (TW)

( * ) Notice: Subject to any disclaimer, the term of this patent is extended or adjusted under 35 U.S.C. 154(b) by 0 days.

(21) Appl. No.: 11/898,006

(22) Filed: Sep. 7, 2007

(65) Prior Publication Data

US 2008/0042301 A1 Feb. 21, 2008

Related U.S. Application Data

(63) Continuation-in-part of application No. 11/028,670, filed on Jan. 5, 2005.

(51) Int. Cl.
  H01L 23/48 (2006.01)
  H01L 23/52 (2006.01)
  H01L 29/40 (2006.01)

(52) U.S. Cl. ..................................................... 257/787

(58) Field of Classification Search .......... 257/659–660, 257/787, 737, 728, 691, 778–780, 774; 174/52.2, 174/255, 259, 266, 262, 264; 361/792, 795, 361/800, 816, 760, 761, 764, 818
See application file for complete search history.

(56) References Cited

U.S. PATENT DOCUMENTS

| | | | |
|---|---|---|---|
| 4,569,786 A | 2/1986 | Deguchi | |
| 5,355,016 A | 10/1994 | Swirbel et al. | |
| 5,677,511 A * | 10/1997 | Taylor et al. | 174/527 |
| 6,376,769 B1 | 4/2002 | Chung | |
| 6,686,649 B1 | 2/2004 | Mathews et al. | |
| 6,740,959 B2 | 5/2004 | Alcoe et al. | |
| 7,187,060 B2 | 3/2007 | Usui | |
| 2004/0020673 A1 | 2/2004 | Mazurkiewicz | |
| 2004/0231872 A1* | 11/2004 | Arnold et al. | 174/35 R |
| 2005/0013082 A1* | 1/2005 | Kawamoto et al. | 361/118 |
| 2005/0045358 A1* | 3/2005 | Arnold | 174/51 |

FOREIGN PATENT DOCUMENTS

WO  WO 2004060034  * 12/2003

* cited by examiner

*Primary Examiner*—Dao H Nguyen
*Assistant Examiner*—Tram H Nguyen
(74) *Attorney, Agent, or Firm*—Cooley Godward Kronish LLP

(57) ABSTRACT

A semiconductor device package includes a semiconductor device mounted and electrically coupled to a substrate, a package body encapsulating the semiconductor device against a portion of an upper surface of the substrate; and an electromagnetic interference shielding layer formed over the package body and substantially enclosing the semiconductor device. The electromagnetic interference shielding layer is a plated metal layer in contact with the package body, and the plated metal layer is connected to a ground trace extending on the upper surface of the substrate.

6 Claims, 7 Drawing Sheets

SEMICONDUCTOR DEVICE PACKAGE AND MANUFACTURING METHOD

CROSS-REFERENCE TO RELATED APPLICATIONS

This application is a continuation-in-part of U.S. application Ser. No. 11/028,670 filed Jan. 5, 2005, entitled "SEMICONDUCTOR DEVICE PACKAGE AND MANUFACTURING METHOD THEREOF," currently pending, hereby incorporated by reference herein in its entirety.

BACKGROUND OF THE INVENTION

1. Field of the Invention

This invention relates to semiconductor device packages, and more specifically to semiconductor device packages which are shielded to protect against electromagnetic interference (EMI).

2. Description of the Related Art

Semiconductor device packages typically have electrical circuitry implemented on a circuit substrate, such as a printed circuit board or a ceramic substrate. The performance of the circuitry may be adversely affected by electromagnetic interference (EMI). Electromagnetic interference (EMI) is the generation of undesired electrical signals, or noise, in electronic system circuitry due to the unintentional coupling of impinging electromagnetic field energy.

The coupling of signal energy from an active signal net onto another signal net is referred to as crosstalk. Crosstalk is within-system EMI, as opposed to EMI from a distant source. Crosstalk is proportional to the length of the net parallelism and the characteristic impedance level, and inversely proportional to the spacing between signal nets.

Electronic systems are becoming smaller, and the density of electrical components in these systems is increasing. As a result, the dimensions of the average circuit element is decreasing, favoring the radiation of higher and higher frequency signals. At the same time, the operating frequency of these electrical systems is increasing, further favoring the incidence of high frequency EMI. EMI can come from electrical systems distant from a sensitive receiving circuit, or the source of the noise can come from a circuit within the same system (crosstalk or near source radiated emission coupling). The additive effect of all these sources of noise is to degrade the performance, or to induce errors in sensitive systems.

SUMMARY OF THE INVENTION

It is therefore an object of the present invention to provide semiconductor device packages which are shielded to protect against electromagnetic interference (EMI).

To achieve the above listed and other objects, a semiconductor device package having features of the present invention generally includes a semiconductor device mounted and electrically coupled to a substrate, a package body encapsulating the semiconductor device against a portion of an upper surface of the substrate; and an electromagnetic interference shielding layer formed over the package body and substantially enclosing the semiconductor device. Preferably, the electromagnetic interference shielding layer is connected to ground potential, e.g., a ground trace extending on the upper surface of the substrate.

According to one aspect of the invention, the electromagnetic interference shielding layer may be a housing of electrically conductive thermoplastic or thermosetting compound which comprises a thermoplastic or thermosetting matrix and a plurality of conductive fillers compounded therewith. The housing may be securely attached to the package body via an adhesive layer or directly mounted on the package body by an enforced inserting method such that the housing fits tightly against and is in contact with the package body.

According to another aspect of the invention, the electromagnetic interference shielding layer may be a layer of conductive paint or an electroless plated metal layer in contact with the package body.

According to another aspect of the invention, the electromagnetic interference shielding layer may be a metal cover securely attached to the package body via an adhesive layer.

The present invention further provides a method for manufacturing the semiconductor device package mentioned above. The method includes the following steps: (a) attaching a plurality of semiconductor devices onto a substrate strip including a plurality of substrate each having at least one ground trace extending on an upper surface of the substrate; (b) electrically coupling the semiconductor devices to the substrate strip; (c) encapsulating the semiconductor devices against an upper surface of the substrate strip to form a plurality of package bodies each encapsulating one of the semiconductor devices on the substrate strip wherein each of the ground traces is positioned between two adjacent package bodies; and (d) providing an electromagnetic interference shielding layer over each of the package bodies such that the electromagnetic interference shielding layer is connected to the ground trace.

The present invention further provides another method for manufacturing the semiconductor device package mentioned above. The method includes the following steps: (a) electrically coupling the semiconductor devices to the substrate strip; (b) encapsulating the semiconductor devices against an upper surface of the substrate strip to form a molded product; (c) conducting a singulation step to separate the molded product into a plurality of individual molded units; and (d) providing an electromagnetic interference shielding layer over each of the molded units.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1A:
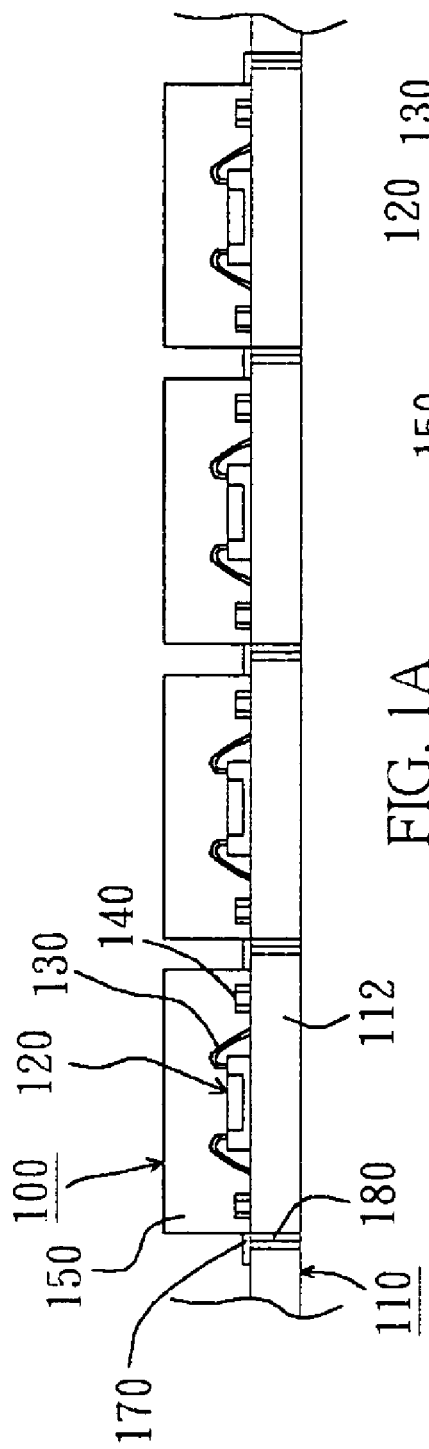
FIG. 1A to 1C illustrate in cross-section major steps of fabrication of a semiconductor device package according to one embodiment of the present invention.
Figure 1B:
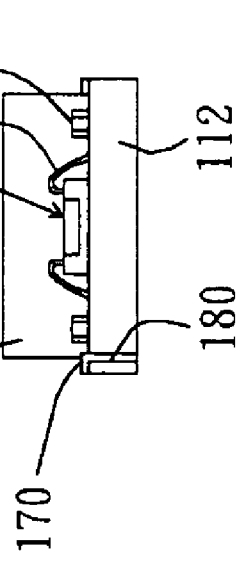
Figure 1C:
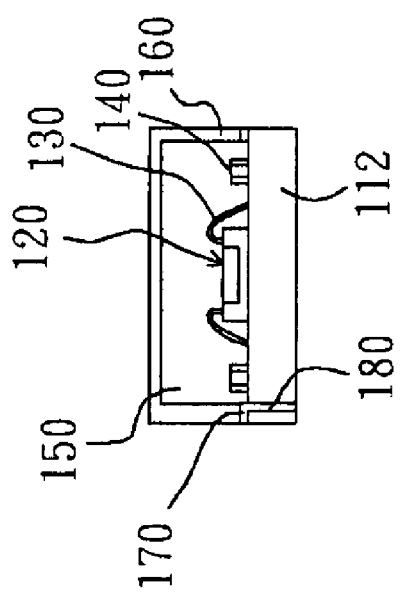

FIG. 1A to FIG. 1C illustrate a process for making a semiconductor device package according to one embodiment of the present invention.

FIG. 1A shows four molded products 100 (only one is denoted in FIG. 1A) provided on a substrate strip 110. The substrate strip 110 comprises a plurality of substrates 112 (only one is denoted in FIG. 1A). Though only four substrates 112 are shown in FIG. 1A, a substrate strip for use with the invention can include any numbers of substrates that is compatible with the manufacturing equipment, e.g., mold, being used. Each of the molded product 100 includes at least one semiconductor device 120 attached to a substrate 112 by means of a conductive adhesive (not shown) such as a silver-filled epoxy or a non-conductive adhesive (not shown). The semiconductor device 120 is connected to the substrate 112 by a plurality of bonding wires 130 which act as electrical input/output (I/O) connections to a first set of contacts (not shown), e.g., conductive traces or pads, provided on the upper surface of the substrate 112. Alternatively, the semiconductor device 120 may be connected to the substrate 112 by a plurality of solder balls. The solder balls may be formed on an active surface of the semiconductor device 120 using one of any known bumping procedures. The upper surface of the substrate 112 is also provided with a second set of contacts (not shown) for electrical coupling to SMT devices 140. For making electrical connection to an outside printed circuit board, the lower surface of the substrate is provided with a third set of contacts (not shown) which are electrically interconnected to the first set of contacts and the second set of contacts, and, usually, a plurality of solder balls (not shown) are mounted on the third set of contacts of the substrate 112. The substrate strip 110 may be formed from a core layer made of fiberglass reinforced BT (bismaleimide-triazine) resin or FR-4 fiberglass reinforced epoxy resin thereby increasing the mechanical strength of the substrate strip 110.

As shown in FIG. 1A, each of the semiconductor devices 120 is encapsulated against the upper surface of the substrate strip 110 to form the aforementioned molded products 100. After encapsulating, each of the semiconductor devices 120 is encapsulated in a package body 150. Thereafter, a singulation step is conducted to separate the assembly shown in FIG. 1A into individual semifinished products (see FIG. 1B).

Thereafter, a housing 160 of electrically conductive thermoplastic or thermosetting compound is disposed on the package body 150 to reduce the amount of radiation which can penetrate therethrough thereby reducing the total dose radiation received at the semiconductor device 120 to a level less than the total dose tolerance of the semiconductor device 120. Specifically, the electrically conductive thermoplastic or thermosetting compound may comprise a thermoplastic or thermosetting matrix and a plurality of conductive fillers compounded therewith. Suitable conductive fillers for use with the present invention include stainless steel fibers, copper fibers, metal powders/particulates, nickel-coated graphite (NCG Fiber), and metal coated substrates (non-fiber) such as nickel-graphite powder, nickel-mica, or silver-glass beads. The thermoplastic matrix may be formed from thermoplastic resins such as PP, PE, PS, ABS, EVA and PVC. Note that the housing according to the present invention can be obtained in such a manner that the aforementioned conductive compound is pre-molded in a shape conform to the contour of the package body 150. The housing 160 may be securely attached to the package body 150 via an adhesive layer (not shown), preferably a conductive adhesive layer which may be formed by dipping or dispensing method.

Alternatively, the housing 160 may be directly mounted on the package body 150 by an enforced inserting method such that the housing 160 fits tightly against the package body 150 for securing the housing 160 in place. In this embodiment, the housing 160 is in contact with the package body 150 and no adhesive layer is provided therebetween.

Preferably, the housing 160 is connected to ground potential. Specifically, the housing 160 may be secured to a ground trace 170 extending on the upper surface of the substrate 112 by the conductive adhesive layer mentioned above. The ground trace 170 is connected to one independent grounding portion (not shown) provided in the substrate 112 by a dedicated vertical terminal such as via 180. The grounding portion may be distributed in the substrate 112 in any available location, and are electrically joined to an electrical ground of an external printed circuit (PC) main board (not shown) for supplying ground potential.

The substrate strip for use with the present invention may has a solder resist (not shown) formed thereon and the solder resist has openings formed corresponding to the aforementioned contacts and the ground trace 170 such that the contacts or ground trace 170 are exposed from the solder resist.

Figure 2A:
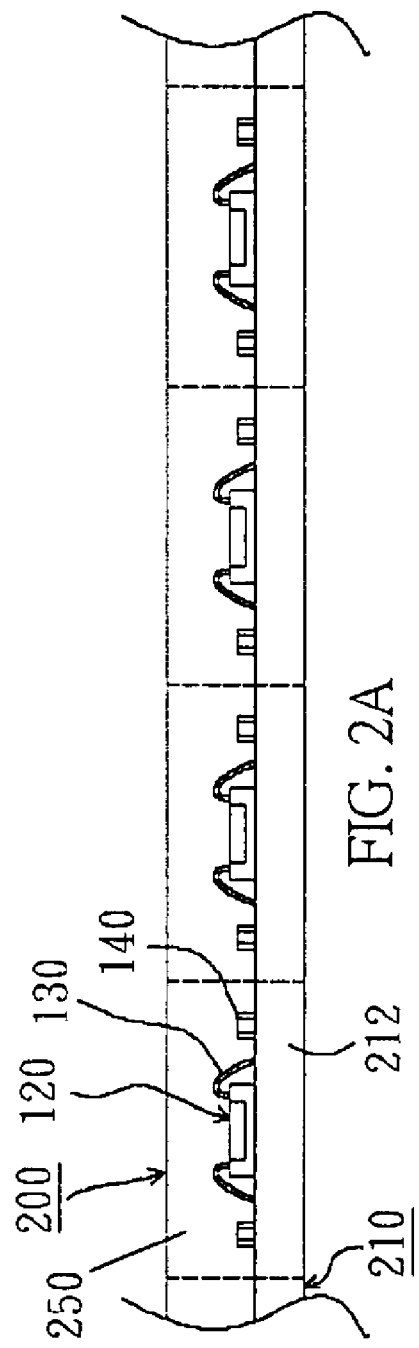
FIG. 2A to 2C illustrate in cross-section major steps of fabrication of a semiconductor device package according to another embodiment of the present invention.
Figure 2B:
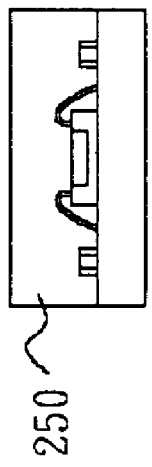
Figure 2C:
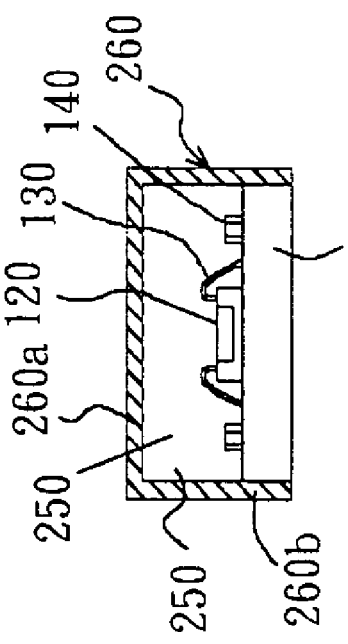

FIG. 2A to FIG. 2C illustrate a process for making a semiconductor device package according to another embodiment of the present invention.

After the semiconductor devices 120 and the SMT devices 140 are respectively mounted to the substrates 212 and a regular wire-bonding process is performed to make interconnections between the devices 120 and the substrates 212, all of the semiconductor devices 120 and the SMT devices 140 are encapsulated against the upper surface of a substrate strip 210 to form a molded product 200 (see FIG. 2A). After encapsulating, all of the semiconductor devices 120 including and the SMT devices 140 are encapsulated in a package body 250. Usually, a MAP (mold array package) molding process is used to accomplish this encapsulation. Thereafter, post-mold curing and singulation steps were conducted to obtain an individual molded unit as shown in FIG. 2B. In the singulation process, a resin-bond saw blade is used to cut the molded product 200 shown in FIG. 2A into individual molded units along predetermined dicing lines (e.g., dashed lines shown in FIG. 2A).

Thereafter, a housing 260 of electrically conductive thermoplastic or thermosetting compound is disposed on the package body 250 for providing EMI shielding. Specifically, the housing 260 is formed in such a manner that the aforementioned conductive compound is pre-molded in a shape conform to the contour of the molded unit shown in FIG. 2B. As shown in FIG. 2C, the housing 260 has a main body 260a and a side wall 260b extending from the main body 260a, and the bottom of the side wall 260b is flush with the lower surface of the substrate 212. The housing 260 may be securely attached to the molded unit shown in FIG. 2B via an adhesive layer (not shown), preferably a conductive adhesive layer.

Alternatively, the housing 260 may be directly mounted on the molded unit shown in FIG. 2B by an enforced inserting method such that the housing 260 fits tightly against the molded unit shown in FIG. 2B for securing the housing 260 in place. In this embodiment, the housing 260 is in contact with the package body 150 and no adhesive layer is provided therebetween.

Preferably, the housing 260 is connected to ground potential. Specifically, the housing 260 may be connected to one independent grounding portion (not shown) provided in the substrate 212. The grounding portion may be distributed in the substrate 212 in any available location, and are electrically joined to an electrical ground of an external printed circuit (PC) main board (not shown) for supplying ground potential. Alternatively, the bottom of the side wall 260b of the housing 260 may be directly connected to an electrical ground of an external printed circuit (PC) main board (not shown).

Figure 3A:
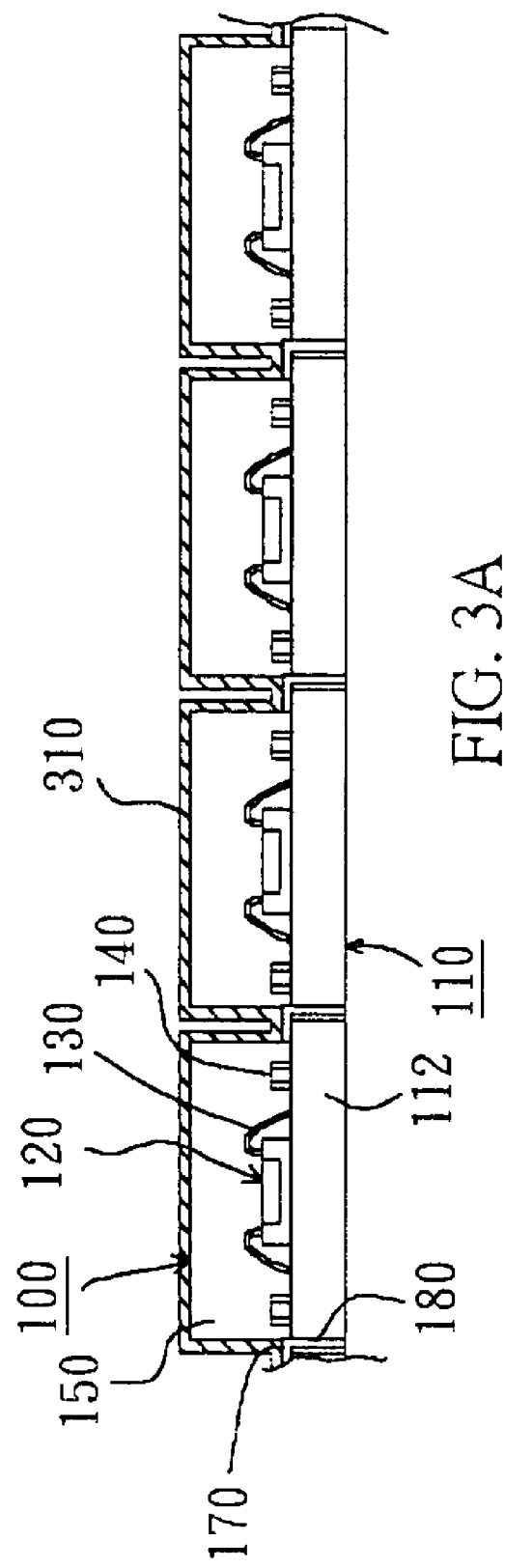
FIG. 3A and FIG. 3B illustrate in cross-section major steps of fabrication of a semiconductor device package according to another embodiment of the present invention.
Figure 3B:
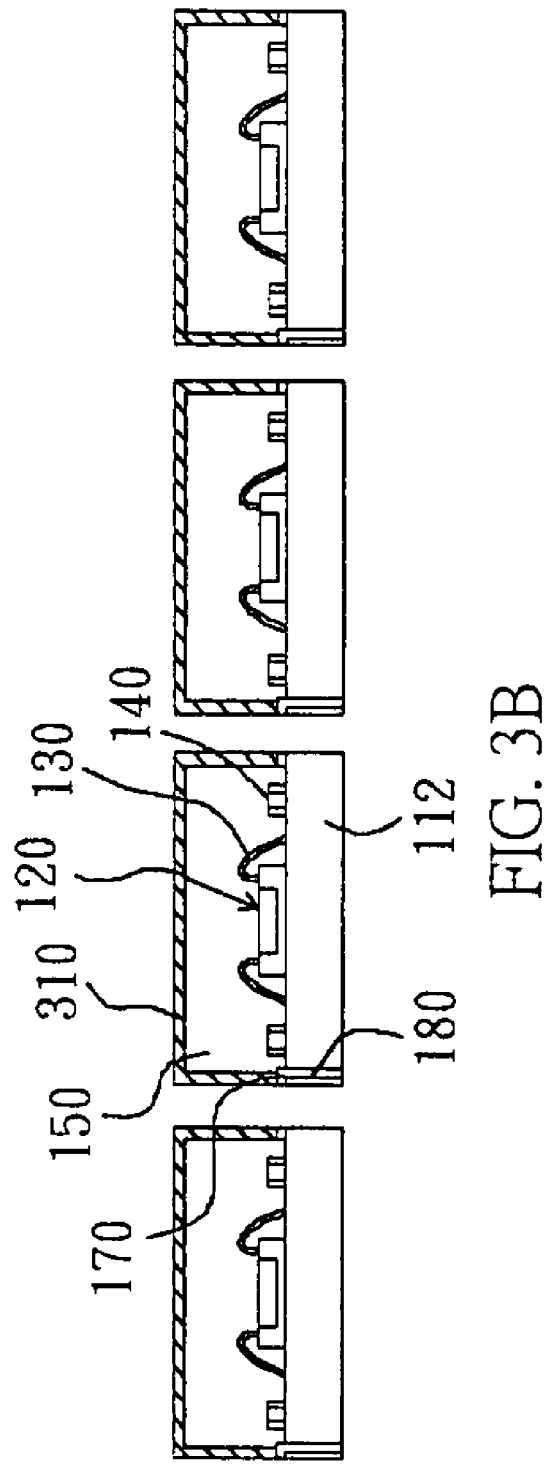

FIG. 3A and FIG. 3B illustrate a process for making a semiconductor device package according to another embodiment of the present invention. Referring to FIG. 3A, a conductive paint layer 310, e.g., a conductive ink layer, is directly formed over the molded products 100 and a portion of the substrate strip 110 for providing EMI shielding. The molded products 100 and the substrate strip 110 are identical to those shown in FIG. 1A, and will not be described hereinafter in further detail. The conductive paint layer 310 may be applied in the same manner to common paints by using a spray gun (or a brush) or via a dipping step. The conductive paint includes conductive fillers such as carbon black or any conductive metal (most commonly copper, nickel, silver, and combinations thereof) mixed with a nonconductive carrier. Note that the conductive paint layer 310 may be replaced with an electroless plated metal layer.

Thereafter, a singulation step is conducted to separate the assembly shown in FIG. 3A into individual semiconductor device packages (see FIG. 3B). Preferably, the conductive paint layer 310 is connected to ground potential in a manner substantially identical to that described with reference to FIGS. 1A to 1C.

Figure 4A:
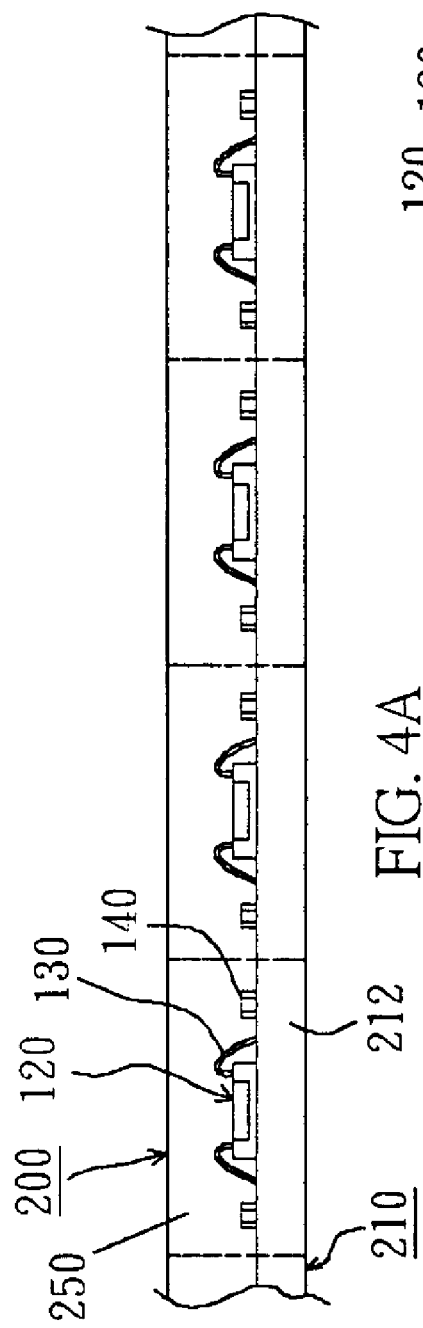
FIG. 4A to 4C illustrate in cross-section major steps of fabrication of a semiconductor device package according to another embodiment of the present invention.
Figure 4B:
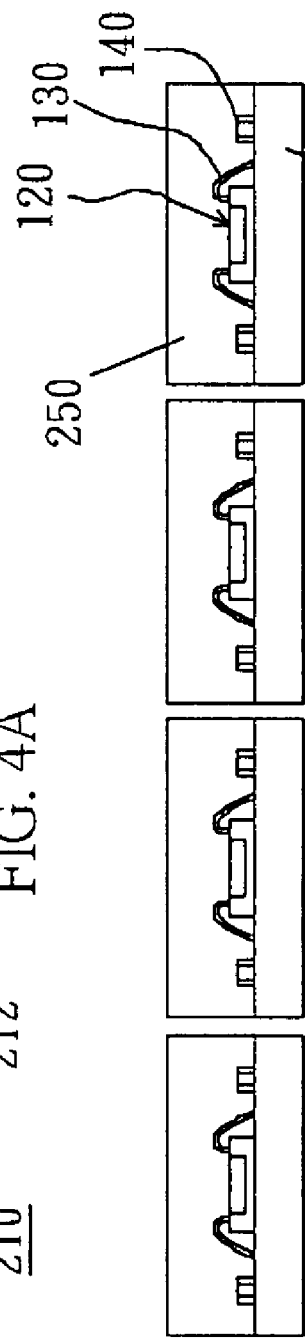
Figure 4C:
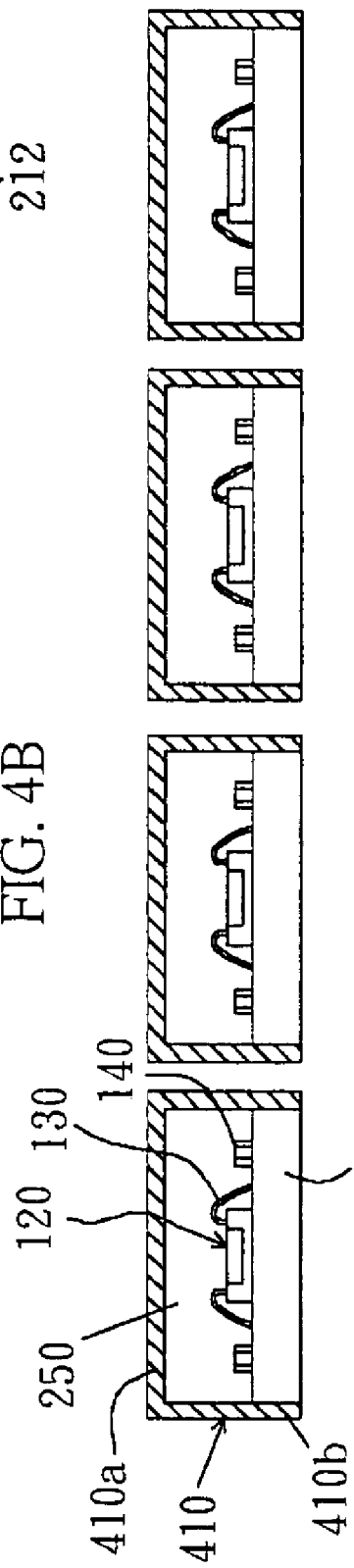

FIG. 4A to FIG. 4C illustrate a process for making a semiconductor device package according to another embodiment of the present invention. After a saw blade is used to cut the molded product 200 shown in FIG. 4A into individual molded units shown in FIG. 4B along predetermined dicing lines (e.g., dashed lines shown in FIG. 4A), a conductive paint layer 410 is respectively formed over the molded units shown in FIG. 4B for providing EMI shielding. The molded product 200 and the substrate strip 210 are identical to those shown in FIG. 2A, and will not be described hereinafter in further detail. The conductive paint layer 410 may be applied in the same manner as described above except that the conductive paint layer 410 has a main body 410a and a side wall 410b extending from the main body 410a, and the bottom of the side wall 410b is flush with the lower surface of the substrate 212. Note that the conductive paint layer 410 may be replaced with an electroless plated metal layer. Preferably, the conductive paint layer 410 is connected to ground potential in a manner substantially identical to that described with reference to FIGS. 2A to 2C.

Figure 5A:
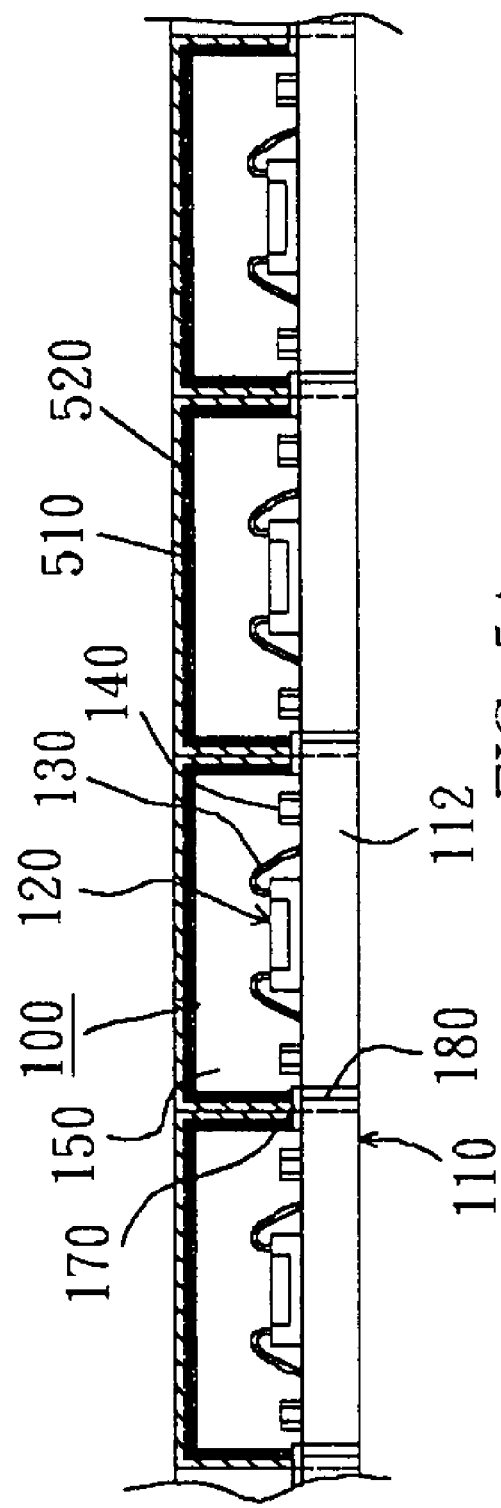
FIG. 5A and FIG. 5B illustrate in cross-section major steps of fabrication of a semiconductor device package according to another embodiment of the present invention.
Figure 5B:
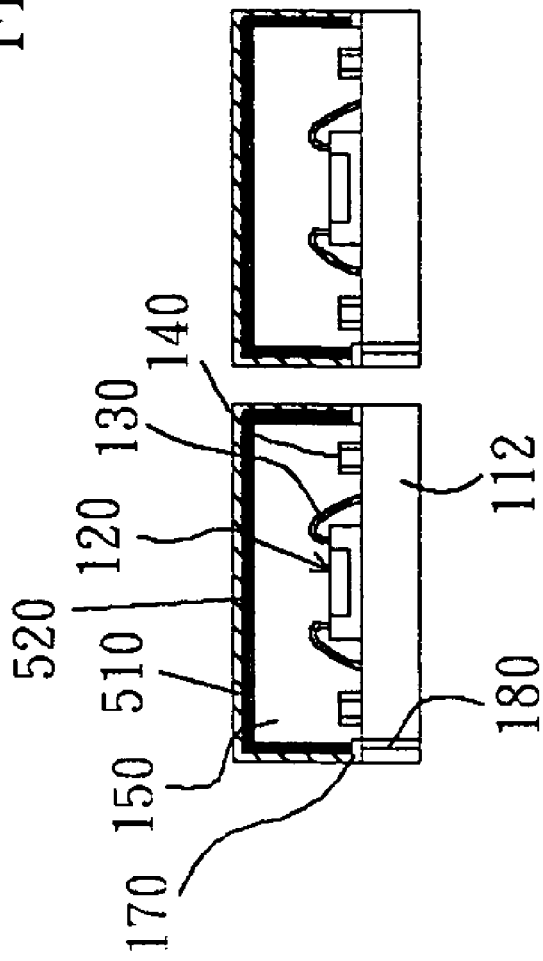

FIG. 5A and FIG. 5B illustrate a process for making a semiconductor device package according to another embodiment of the present invention. Referring to FIG. 5A, a plurality of metal covers 510 are securely attached to the package bodies 150 via adhesive layers 520 for providing EMI shielding, respectively. The molded products 100 and the substrate strip 110 are identical to those shown in FIG. 1A, and will not be described hereinafter in further detail. The metal cover 510 may be made of any conductive metal (most commonly copper, nickel, silver, and combinations thereof). Note that the adhesive layer 520 may be replaced by a double-coated adhesive tape comprised of a polymer film coated on both sides with adhesive. Thereafter, a singulation step is conducted to separate the assembly shown in FIG. 5A into individual semiconductor device packages (see FIG. 5B). Preferably, the metal cover 510 is connected to ground potential in a manner substantially identical to that described with reference to FIGS. 1A to 1C. Alternatively, the metal cover 510 may be secured to the ground trace 170 on the substrate 112 by a soldering interface (e.g., Au—Sn solder), a conductive adhesive interface, or resistance welding.

Figure 6A:
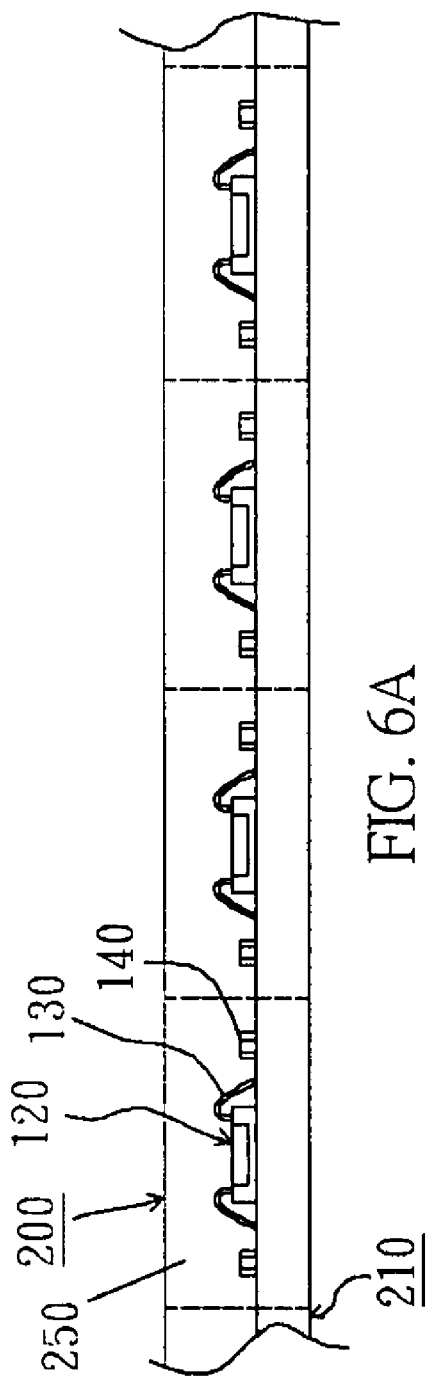
FIG. 6A to 6C illustrate in cross-section major steps of fabrication of a semiconductor device package according to another embodiment of the present invention.
Figure 6B:
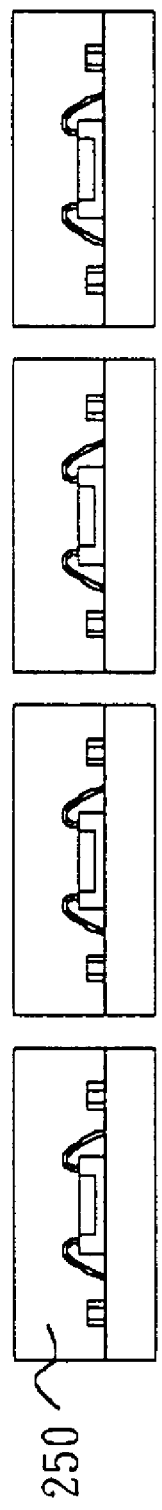
Figure 6C:
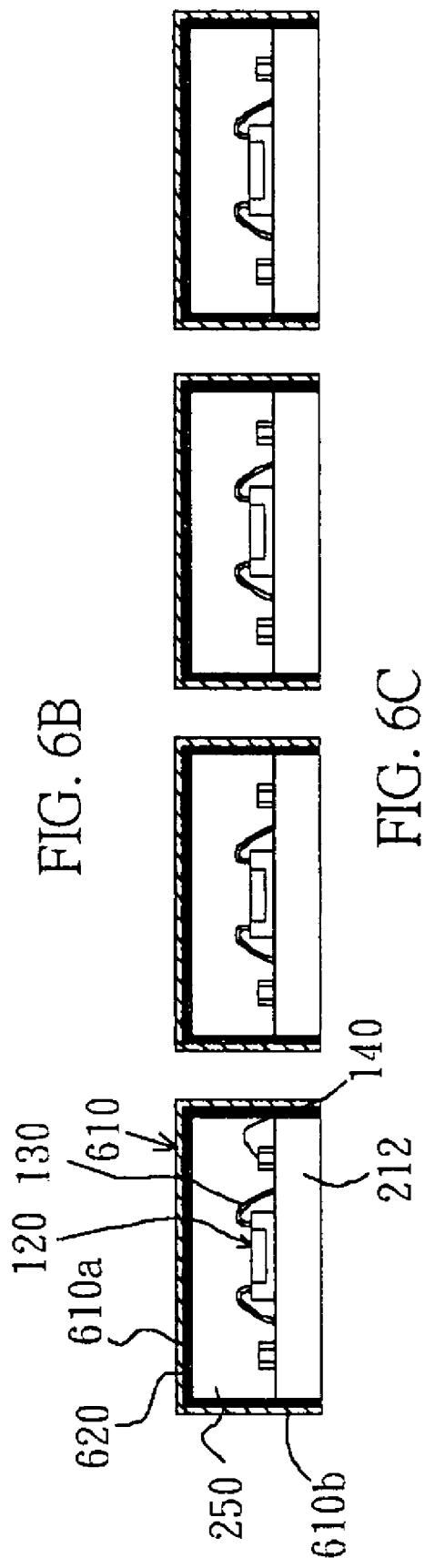

FIG. 6A to FIG. 6C illustrate a process for making a semiconductor device package according to another embodiment of the present invention. After a saw blade is used to cut the molded product 200 shown in FIG. 6A into individual molded units shown in FIG. 6B along predetermined dicing lines (e.g., dashed lines shown in FIG. 6A), a plurality of metal covers 610 (see FIG. 6C) are securely attached to the package bodies 250 via adhesive layers 620 for providing EMI shielding, respectively. The molded product 200 and the substrate strip 210 are identical to those shown in FIG. 2A, and will not be described hereinafter in further detail. The metal cover 610 is substantially identical to the metal cover 510 mentioned above except that the metal cover 610 has a main body 610a and a side wall 610b extending from the main body 610a, and the bottom of the side wall 610b is flush with the lower surface of the substrate 212. Preferably, the metal cover 610 is connected to ground potential in a manner substantially identical to that described with reference to FIGS. 2A to 2C.

Figure 7:
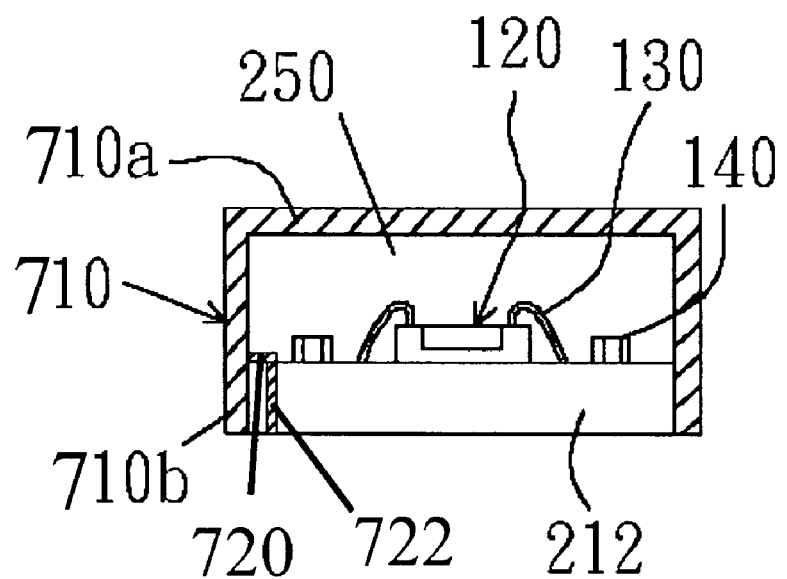
FIG. 7 is a cross-sectional view of a semiconductor device package according to another embodiment of the present invention.

FIG. 7 shows a semiconductor device package according to another embodiment of the present invention mainly including a semiconductor device 120 attached to a substrate 212 by means of a conductive adhesive (not shown). The semiconductor device 120 is connected to the substrate 212 by a plurality of bonding wires 130 which act as electrical input/output (I/O) connections to a first set of contacts (not shown), e.g., conductive traces or pads, provided on the upper surface of the substrate 212. Alternatively, the semiconductor device 120 may be connected to the substrate 212 by a plurality of solder balls. The upper surface of the substrate 112 is also provided with a second set of contacts (not shown) for electrical coupling to SMT devices 140. For making electrical connection to an outside printed circuit board, the lower surface of the substrate is provided with a third set of contacts (not shown) which are electrically interconnected to the first set of contacts and the second set of contacts, and, usually, a plurality of solder balls (not shown) are mounted on the third set of contacts of the substrate 212.

As shown in FIG. 7, the semiconductor device 120 is encapsulated in a package body 250 against the upper surface of the substrate 212. The package body 250 has a side surface flush with a side surface of the substrate 212, so as to define a coplanar side surface. A plated metal layer 710, e.g., an electroless plated metal layer, is formed over the package body 250 and substantially encloses the semiconductor device 120 thereby acting as an electromagnetic interference shielding layer to reduce the amount of radiation which can penetrate therethrough. Preferably, the plated metal layer 710 has a main body 710a and a side wall 710b extending from the main body 710a, and the bottom of the side wall 710b is flush with the lower surface of the substrate 212. The side wall 710b of the plated metal layer 710 is disposed on and parallel to the coplanar side surface defined by the side surface of the package body 250 and the side surface of the substrate 212. Note that the plated metal layer 710 is connected to a ground trace 720 extending on the upper surface of the substrate 112. The ground-trace 720 of the substrate has a portion exposed on the coplanar side surface (defined by the side surface of the package body 250 and the side surface of the substrate 212) for connecting to the plated metal layer 710. The exposed portion of the ground trace 720 is sandwiched between the side surface of the package body 250 and the side surface of the substrate 212. The ground trace 720 is connected to one independent grounding portion (not shown) provided in the substrate 212 by a dedicated vertical terminal such as via 722. The grounding portion may be distributed in the substrate 212 in any available location, and are electrically joined to an electrical ground of an external printed circuit (PC) main board (not shown) for supplying ground potential.

Figure 8:
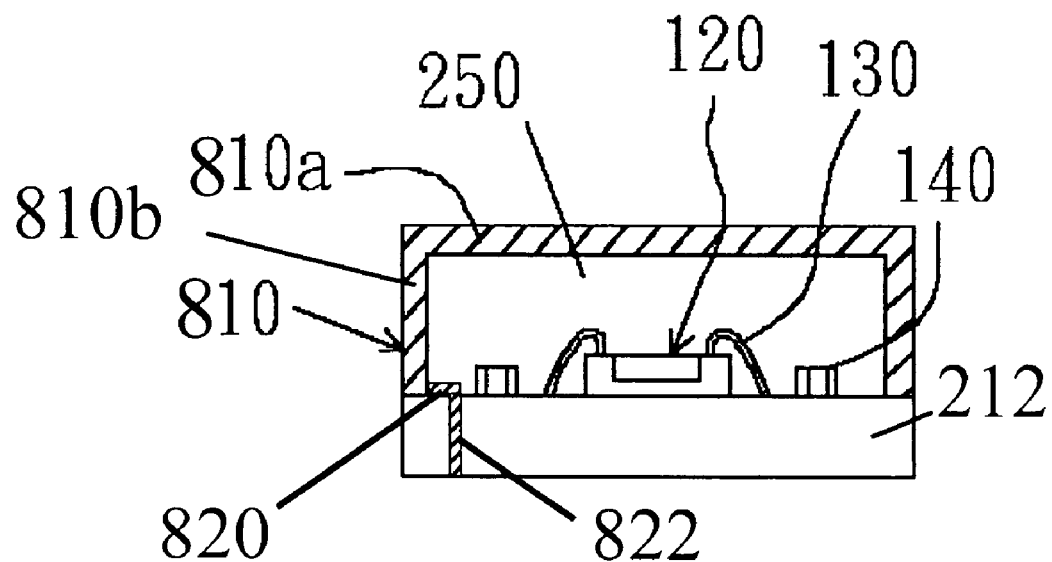
FIG. 8 is a cross-sectional view of a semiconductor device package according to another embodiment of the present invention.

FIG. 8 shows a semiconductor device package according to another embodiment of the present invention. The semiconductor device package of FIG. 8 is substantially identical to the semiconductor device package of FIG. 7 except that the bottom of the side wall 810b of the plated metal layer 810 is in contact with the upper surface of the substrate 212 instead of flushing with the lower surface of the substrate 212. In addition, the side wall 810b of the plated metal layer 810 is flush with the side surface of the substrate 212, so as to define a coplanar side surface.

Although the invention has been explained in relation to its preferred embodiments, it is to be understood that many other possible modifications and variations can be made without departing from the spirit and scope of the invention as hereinafter claimed.

What is claimed is:

1. A semiconductor device package comprising:
   a substrate having at least one ground trace extending on an upper surface thereof;
   a semiconductor device mounted and electrically coupled to the substrate;
   a package body encapsulating the semiconductor device against a portion of the upper surface of the substrate; and
   an electromagnetic interference shielding layer formed over the package body and substantially enclosing the semiconductor device;
   wherein the electromagnetic interference shielding layer is a plated metal layer in contact with the package body and in contact with the upper surface of the substrate, and the plated metal layer is connected to the ground trace; and
   wherein the plated metal layer has a main body and a side wall extending from the main body, and the bottom of the side wall is in contact with the upper surface of the substrate, while the side wall of the plated metal layer is flush with a side surface of the substrate, so as to define a coplanar side surface.

2. The semiconductor device package as claimed in claim 1, wherein the plated metal layer is an electroless plated metal layer.

3. The semiconductor device package as claimed in claim 1, further comprising a SMT device mounted on the upper surface of the substrate and encapsulated in the package body and the electromagnetic interference shielding layer.

4. The semiconductor device package as claimed in claim 1, wherein the package body has a side surface that is laterally recessed relative to the side surface of the substrate.

5. The semiconductor device package as claimed in claim 4, wherein the side surface of the package body is laterally recessed by an amount corresponding to a thickness of the side wall of the plated metal layer.

6. The semiconductor device package as claimed in claim 1, wherein the substrate includes a via at least partially extending between the upper surface of the substrate and a lower surface of the substrate, and the ground trace is connected to the via.

* * * * *